(12) United States Patent
Maryfield et al.

(10) Patent No.: US 8,455,972 B2
(45) Date of Patent: Jun. 4, 2013

(54) FLIP-CHIP PHOTODIODE

(75) Inventors: Tony Maryfield, Poway, CA (US);
Mahyar Dadkhah, San Diego, CA (US);
Thomas Davidson, Santee, CA (US)

(73) Assignee: Cubic Corporation, San Diego, CA (US)

( * ) Notice: Subject to any disclaimer, the term of this patent is extended or adjusted under 35 U.S.C. 154(b) by 0 days.

(21) Appl. No.: 13/584,457

(22) Filed: Aug. 13, 2012

(65) Prior Publication Data
US 2012/0306036 A1 Dec. 6, 2012

Related U.S. Application Data

(62) Division of application No. 12/171,944, filed on Jul. 11, 2008, now abandoned.

(60) Provisional application No. 60/949,229, filed on Jul. 11, 2007, provisional application No. 60/949,230, filed on Jul. 11, 2007, provisional application No. 60/949,200, filed on Jul. 11, 2007.

(51) Int. Cl.
*H01L 31/00* (2006.01)

(52) U.S. Cl.
USPC .................. 257/460; 257/432; 257/E31.11

(58) Field of Classification Search
USPC ............... 257/432–437, 458, 460–461, 466, 257/E31.001, E31.11, E31.032
See application file for complete search history.

(56) References Cited

U.S. PATENT DOCUMENTS

| | | | | |
|---|---|---|---|---|
| 3,845,296 A | * | 10/1974 | Schnitzler | 250/214 VT |
| 4,328,508 A | * | 5/1982 | Kressel et al. | 257/184 |
| 2002/0096729 A1 | * | 7/2002 | Tu et al. | 257/433 |
| 2004/0129991 A1 | * | 7/2004 | Lai et al. | 257/433 |
| 2004/0262652 A1 | * | 12/2004 | Goushcha et al. | 257/292 |

* cited by examiner

*Primary Examiner* — Tucker Wright
(74) *Attorney, Agent, or Firm* — Kilpatrick Stockton & Townsend, LLP

(57) ABSTRACT

A photodiode is provided according to various embodiments. In some embodiments, the photodiode includes a substrate and an active region. The active region is configured to receive light through the substrate. In such a configuration, the substrate not only participates in the photodiode operation acts as a light filter depending on the substrate material. In some embodiments, the active region may include solder balls that may be used to couple the photodiode to a printed circuit board. In some embodiments, the active region is coupled face-to-face with the printed circuit board.

9 Claims, 8 Drawing Sheets

FLIP-CHIP PHOTODIODE

CROSS-REFERENCES TO RELATED APPLICATIONS

This application is a divisional of U.S. patent application Ser. No. 12/171,944, filed Jul. 11, 2008, entitled "Flip-Chip Photodiode," which claims the benefit, of commonly assigned U.S. Provisional Patent Application No. 60/949,200, filed Jul. 11, 2007, entitled "Flip Chip Photo-Diode," U.S. Provisional Patent Application No. 60/949,229, filed Jul. 11, 2007, entitled "Flip Chip Quantum Well Modulator," and U.S. Provisional Patent Application No. 60/949,230, filed Jul. 11, 2007, entitled "Integrated Modulating Retro-Reflector," and the disclosures of which are incorporated by reference in their entirety herein for all purposes.

STATEMENT AS TO RIGHTS TO INVENTIONS MADE UNDER FEDERALLY SPONSORED RESEARCH OR DEVELOPMENT

The U.S. Government may have rights in this invention pursuant to Special Operations Command under Contract No. H92222-04-C-0004.

BACKGROUND

This disclosure relates in general to photodiodes. Photodiodes are constructed with an active layer placed upon a substrate that may then be coupled, for example, with a printed circuit board. In some applications, an optical filter may also be included to block unwanted bands of light. The inclusion of the filter often adds weight and complexity, increases costs, and decreases the photodiode field of view.

BRIEF SUMMARY

A flip-chip photo diode is provided according to various embodiments. The flip-chip photodiode may include an active layer, a substrate, and a plurality of solder balls. The active layer comprises a top and a bottom surface such that the top surface of the active layer is coupled with the substrate. In some embodiments, the active layer is coupled with the substrate with an intervening layer, for example, an intrinsic layer, or a gap. The plurality of solder balls may be coupled with the bottom of the active layer and may be configured to couple with a circuit board. In other embodiments a plurality of solder balls may be coupled with the bottom of the substrate and configured to couple with a circuit board. The substrate may include an antireflective coating on the top surface thereof.

A flip-chip photo diode stack is provided according to another embodiment, that includes a substrate, an active area and a printed circuit board. The substrate includes a top surface and a bottom surface. The top surface may be configured to receive light. The active layer includes a top surface and a bottom surface. The top surface of the active area may be coupled with the bottom surface of the substrate. The printed circuit board includes at least a top surface coupled with the active layer. Solder balls, according to another embodiment, may be used to couple the active array to the printed circuit board. An intrinsic layer may, in some embodiments, be included between the active layer and the substrate.

A photodiode is provided according to some embodiments that includes a substrate and an active region. The substrate includes a top surface and a bottom surface. The active region comprises a top surface and a bottom surface. The top surface of the active region may be aligned below the bottom surface of the substrate. The photodiode may be configured to receive light through the top surface of the substrate. At least a portion of the light received through the top surface of the substrate may be incident on the active region. In one embodiment, the substrate may be substantially transparent to light with wavelengths between about 1530 nm and about 1560 nm. In another embodiment, the substrate may be substantially transparent to infrared light.

Further areas of applicability of the present disclosure will become apparent from the detailed description provided hereinafter. It should be understood that the detailed description and specific examples, while indicating various embodiments, are intended for purposes of illustration only and do not limit the scope of the disclosure.

In the appended figures, similar components and/or features may have the same reference label. Where the reference label is used in the specification, the description is applicable to any one of the similar components having the same reference label.

DETAILED DESCRIPTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It should be understood that various changes may be made in the function and arrangement of elements without departing from the spirit and scope as set forth in the appended claims.

In one embodiment, the present disclosure provides for a flip-chip photodiode. In some embodiments, a flip-chip photodiode may use the substrate as a light filter. In other embodiments, a flip-chip diode may include an active layer and a substrate. The active layer may be coupled with the substrate. The coupling of the active layer with the substrate may include direct coupling, indirect coupling, coupling with a gap between, and/or coupling with an intrinsic layer between the two. In embodiments described herein, the photodiode may be constructed from a plurality of semiconductor materials. In other embodiments, the photodiode may be a surface mount device.

Figure 1A:
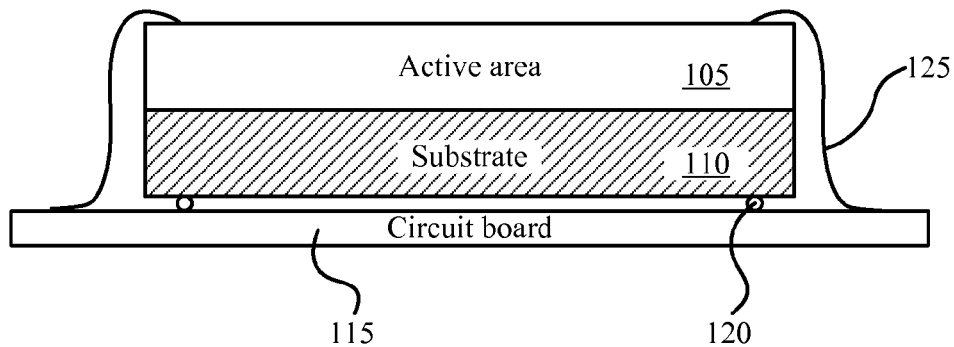
FIG. 1A shows a prior art photodiode.

Referring first to FIG. 1A, a photodiode is shown according to the prior art. As shown, a substrate 110 includes an active area 105 deposited thereon. The substrate 110 is coupled with the circuit board 115 using, for example, solder balls and/or die attach epoxy 120. The active layer 105 is coupled with the circuit board 115 using wire bonds 125. As shown, the active layer 105 is exposed to the incoming light and a filter may be required to cut back on unwanted light sources.

Figure 1B:
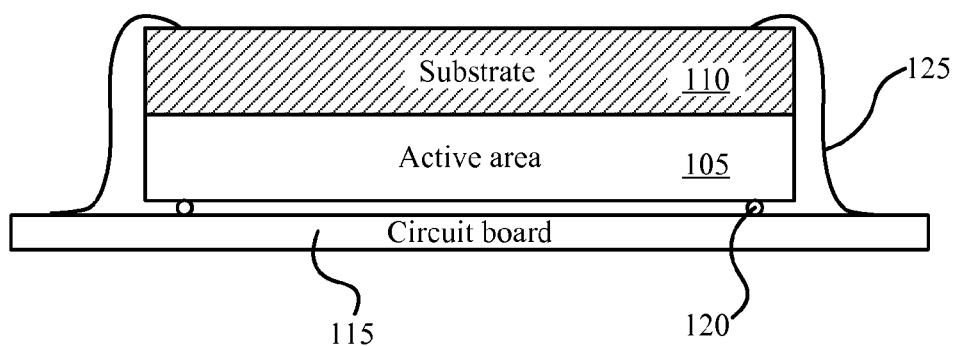
FIG. 1B shows a flip-chip photodiode according to one embodiment.

FIG. 1B shows a photodiode according to one embodiment. In this embodiment, the photodiode is flipped. That is, the substrate 110 is above the active layer 105. In such an embodiment, only light that transmits through the substrate 110 is incident on the active area 105. Thus, the substrate 110 acts not only as a substrate, but also as a light filter. Accordingly, the substrate 110 may be selected based on the wavelength of light that one is interested in filtering. For example, the substrate may comprise indium phosphide (InP) which permits transmission of wavelengths of the desired wavelength, for example of about 1550 nm, and may block other wavelengths. In some embodiments, the desired wavelength may be between about nm. In some embodiments, the substrate 110 may act as a long-pass filter to daylight and may block short wave infrared radiation. In other embodiments, the substrate 110 filters sun light.

The active area 105 may be coupled with solder balls 120 or other connectors used to couple the active area to a circuit board, such as, for example, conductive epoxy bumps. In some embodiments, the active area 105 may include various surface-mount interconnects. These interconnects may include, for example, J-leads, solder balls, pins, fine pitch balls, leads, epoxy bumps, stencil printed polymer bumps, conductive adhesives, stud bumps, etc. Accordingly, the photodiode may be used as a surface-mount device with any type of grid array and/or packaging. In the embodiment shown in FIG. 1B, solder balls 120 may electrically connect the active area 105 with the printed circuit board 115. The substrate, in this embodiment, may use wire bonds to connect the substrate 110 with the circuit board 115.

The substrate 110 may include any semiconductor material. For example, the substrate may comprise indium phosphide, silicon, silicon germanium, and/or indium gallium arsenide. As another example, the active area 105 may include silicon, gallium, indium gallium arsenide, gallium phosphide, silicon carbide, titanium dioxide, germanium, gallium nitride, aluminum gallium nitride, and/or lead sulfide. In some embodiments, the active area 105 comprise a p-type semiconductor material and the substrate 110 comprises an n-type semiconductor material.

The photodiode may comprise any type of photodiode. For example, the photodiode may include a PN photodiode, a PNN photodiode, a PIN photodiode, a Schottky type photodiode, and/or an avalanche type photodiode.

Various embodiments use the substrate as a sunlight filter. Such a filter may eliminate the need for added filter components, which may reduce the photodiode stack height and dimension. Moreover, using the substrate as a sunlight filter reduces the complexity and cost of the photodiode. The sunlight filter also reduces photocurrent within the photodiode according to some embodiments. In other embodiments, the sunlight filter may also reduce power consumption from the photocurrent when the photodiode is reverse biased.

Figure 2A:
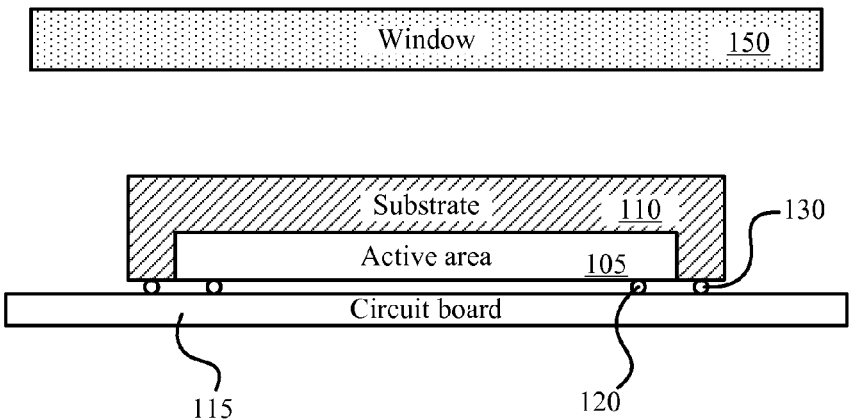
FIGS. 2A-2C show various flip-chip photodiode configurations according to some embodiments.
Figure 2B:
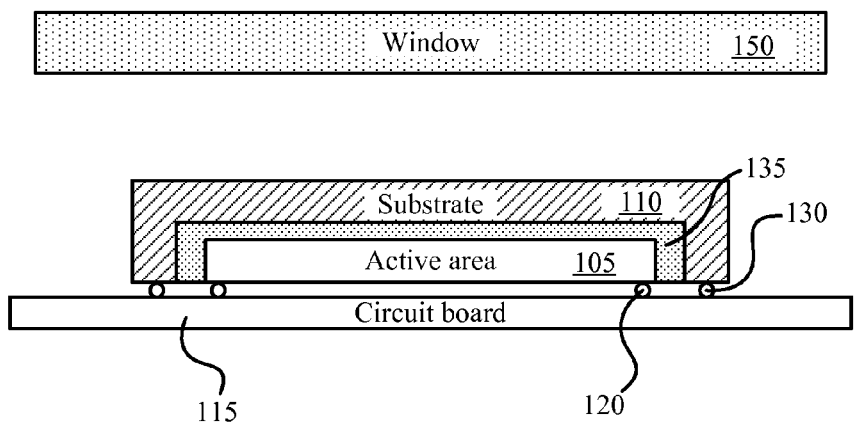
Figure 2C:
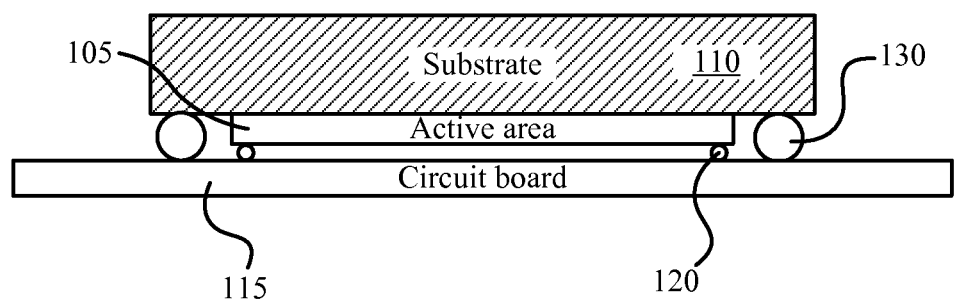

FIGS. 2A and 2B show other flip-chip photodiodes with a window 150 according to some embodiments. The window 150 may provide protection from the elements and/or provide some filtering. Moreover, in FIG. 2A the substrate includes solder balls 130 in a surface mount package. FIG. 2B shows a PIN type photodiode with an intrinsic layer 135 between the substrate 110 and the active area 105. FIG. 2C shows a photodiode with an active area 105 that were constructed using a mesa etch technique according to some embodiments. The edges of the active area 105 may be are protected with a non-conductive layer, such as a passivation layer. In some embodiments, a passivation layer may include benzocyclobutene. In various embodiments, both the N-semiconductor layer and P-semiconductor layer of the photodiode are interconnected with the printed circuit board, for example using epoxy bumps and/or solder.

Figure 3:
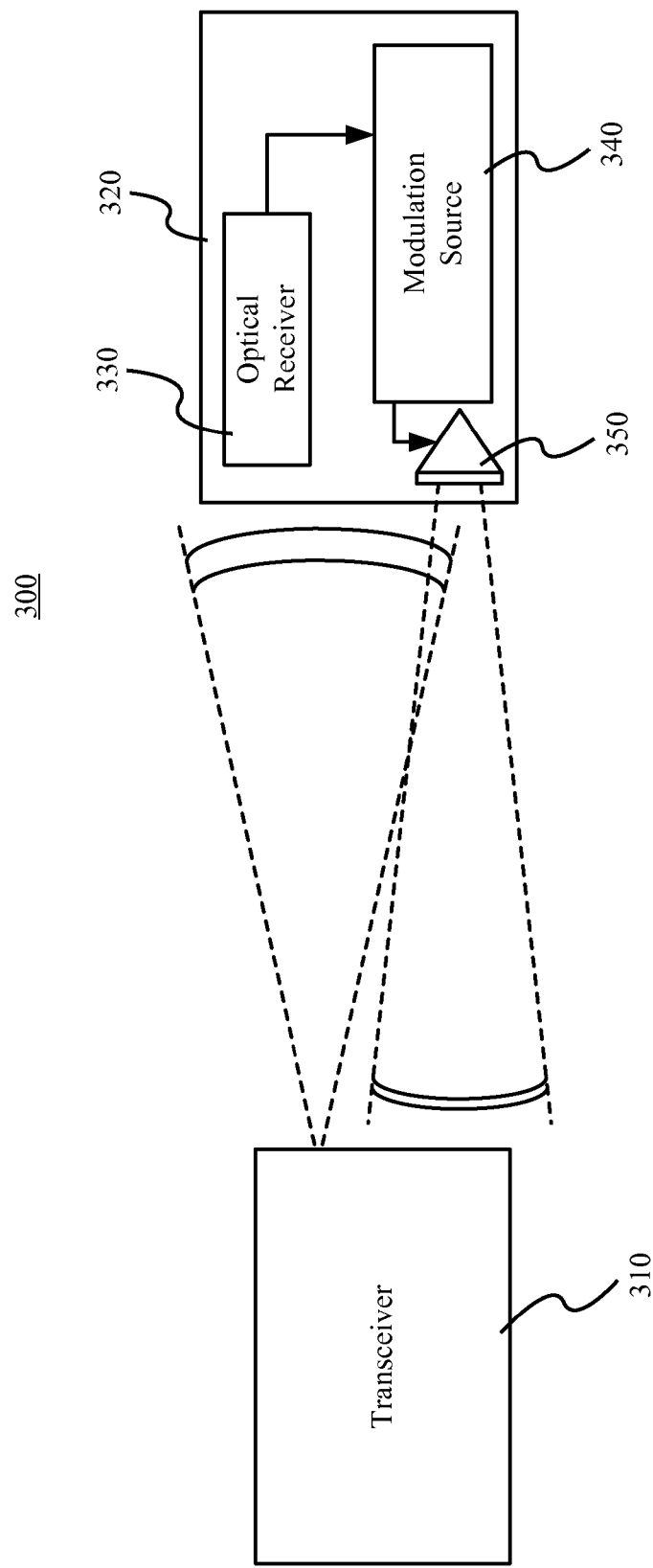
FIG. 3 shows a communication system that may implement a photodiode according to some embodiments.

FIG. 3 shows an optical communication system employing a photodiode according to one embodiment. As shown, transceiver 310 transmits an information bearing optical signal toward an optical tag 320. An optical receiver 330 may be disposed within the optical tag 320 and receives the signal. The optical receiver 330 may include a flip-chip photodiode and may be used to synchronize and phase lock the receiver to an incoming pulsed light source. The incoming light may also coupled to an optical modulator 340 and retro-reflector 350 that modifies the return beam energy with data from the tag. This amplitude modulation may be intercepted by the Interrogating transceiver and decodes the amplitude changes back into serial data bits. In this manner, transceiver 310 and optical tag 320 communicate.

In various embodiments, the inventive photodiode may be included in the optical tag 320 as part of optical receiver 330. As such, the photodiode detects the information bearing signal and may be exposed to significant solar radiation. An optical tag employing a flip-chip photodiodes, for example, may provide a large field of view (e.g., 120 degrees). Moreover, such photodiodes may be inexpensive to construct and have a small size, a low weight, and modest power requirements.

In operation in a solar environment, photodiodes may undergo solar loading. Under the influence of solar loading, conventional photodiodes generate significant sun current, which can increase "shot noise" in the optical receiver, which reduces the signal to noise ratio and the effective optical range. Optical receivers including a flip-chip photodiode, in some embodiments, may exhibit significantly reduced solar current, higher signal-to-noise ratios, and improved optical range improvements. In addition, unlike conventional photodiodes, in some embodiments, flip-chip photodiodes can eliminate the need for an additional narrow-band filter attachment. Narrow-band filters used with conventional photodiodes often limit the field of view, whereas flip-chip photodiodes may avoid such limitations through use of the filtering substrate.

Figure 4:
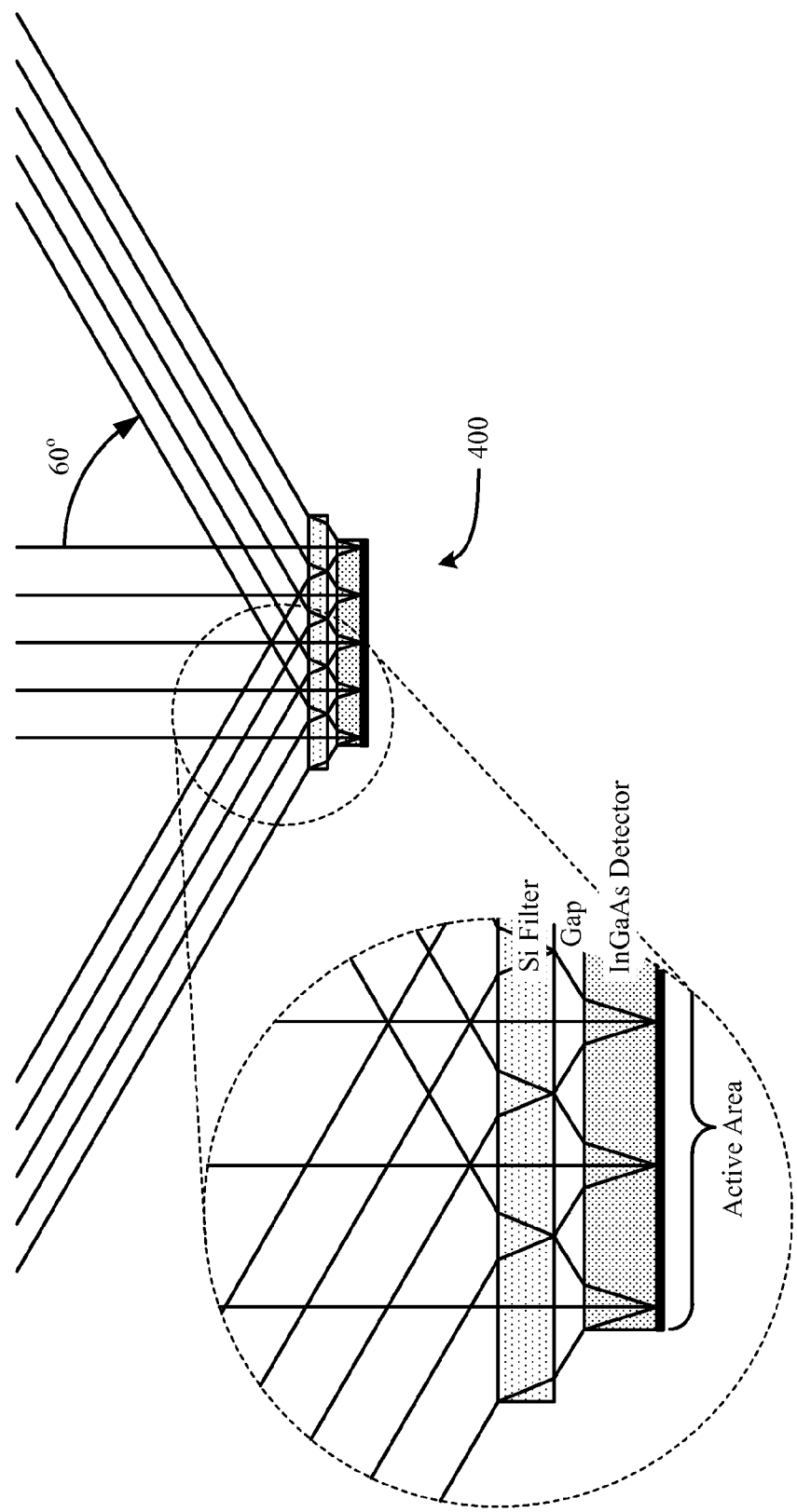
FIG. 4 shows light incident off the active layer of a photodiode according to one embodiment.

FIG. 4 shows a flip-chip photodiode 400 shown with light rays according to one embodiment. As shown, a flip-chip diode according to embodiments described herein, may have about a ±60° field of view. In other embodiments, the field of view, for example, may be about ±50°, ±51°, ±52°, ±53°, ±54°, ±55°, ±56°, ±57°, ±58°, ±59°, ±50°, ±61°, ±62°, ±63°, ±64°, ±65°, ±66°, ±67°, ±68°, ±69° or ±70°. In other embodiments, the field of view may be less than about ±50°. As shown in the expanded view portion, an indium gallium arsenide detector may be used with a silicon filter. The active area, for example, may include indium phosphide.

Figure 5:
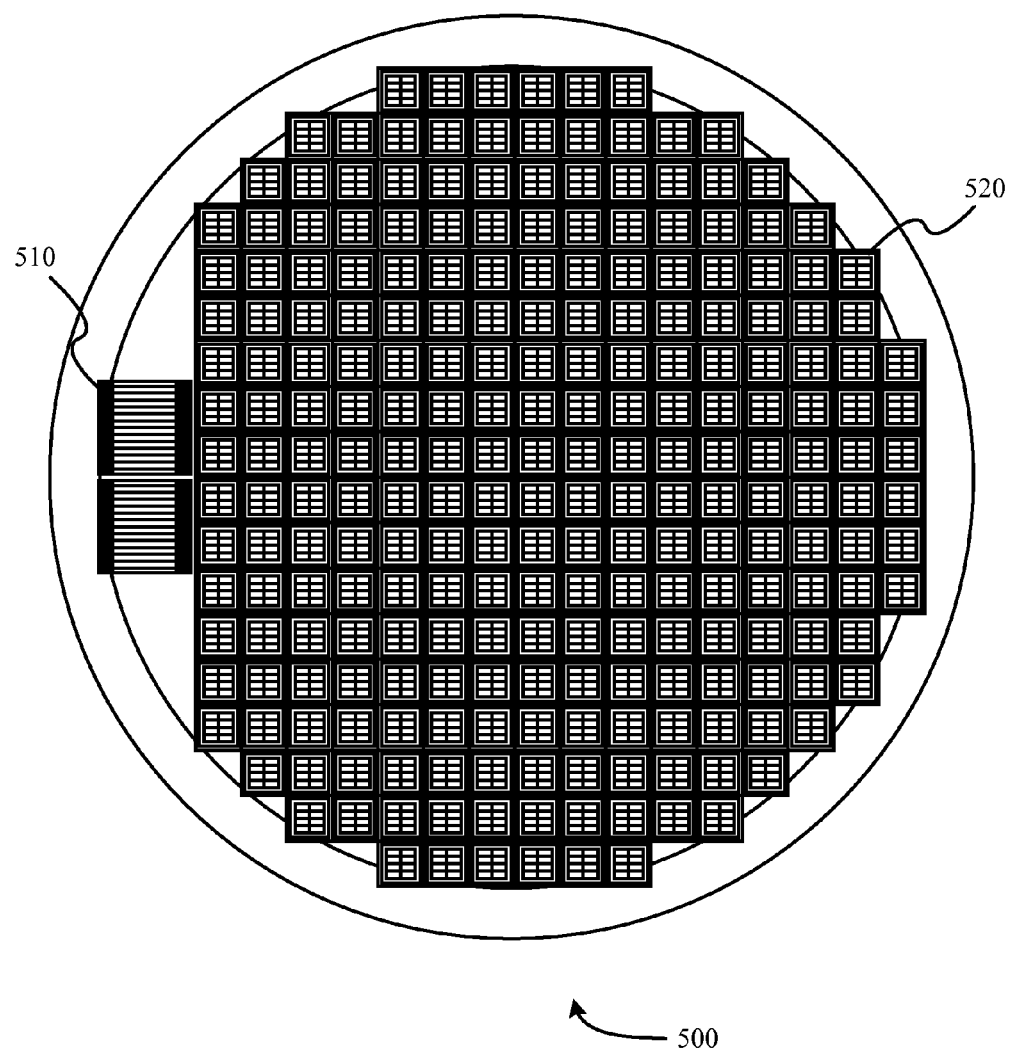
FIG. 5 shows a top view of a photodiode array according to one embodiment.

FIG. 5 shows a top view of a flip-chip photodiode wafer 500 according to one embodiment. The photodiode wafer 500 may include a plurality of photodiodes 520 as shown. Any number of photodiodes may be used within an array. In this embodiment, two quality control test sites 510 are included.

Figure 6:
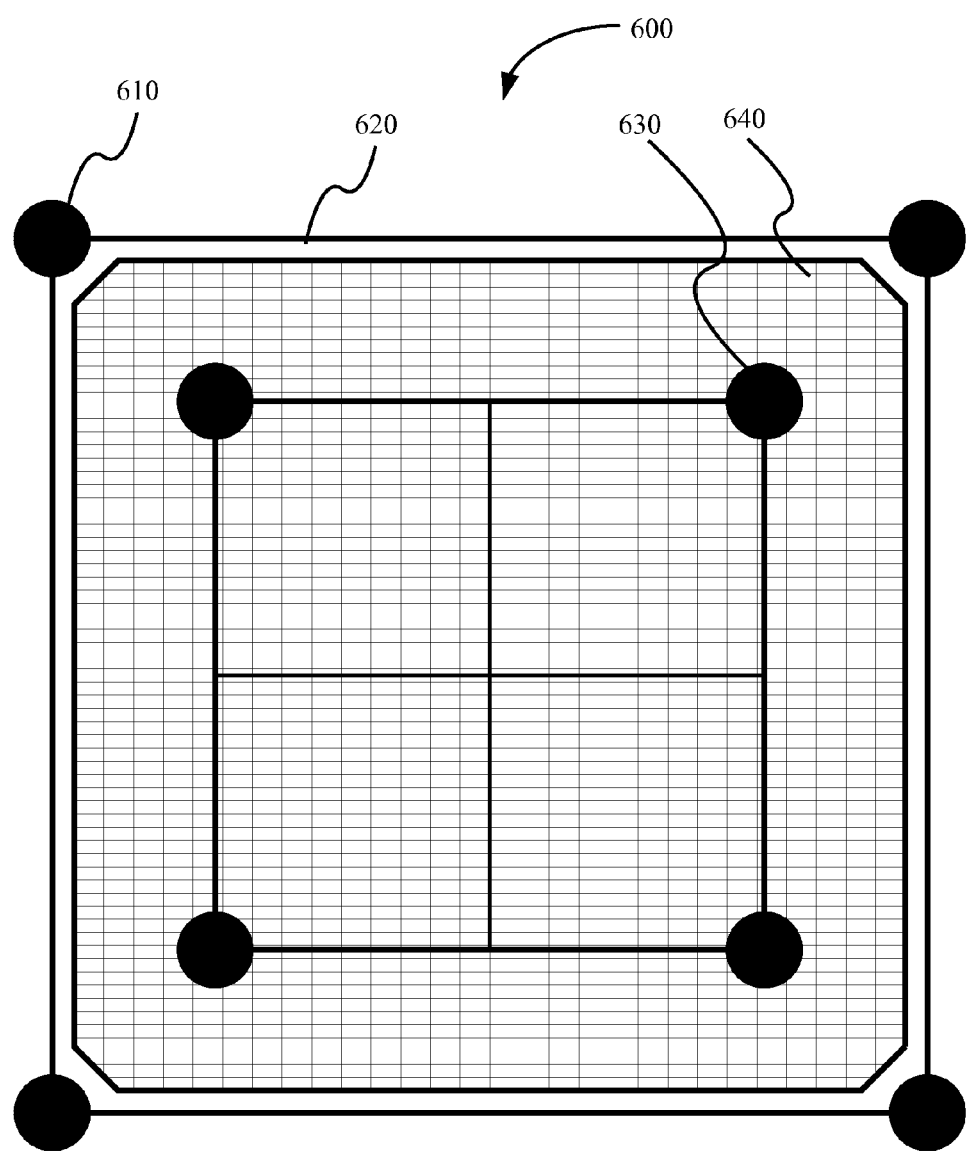
FIG. 6 shows a bottom view of a photodiode according to one embodiment.

FIG. 6 shows a bottom view of a surface mount package flip-chip photodiode 600 according to one embodiment. The active area 640 is shown surrounded by the substrate 620. Solder balls 630 are coupled with the active area 640 and solder balls 610 are coupled with the substrate 620.

Figure 7A:
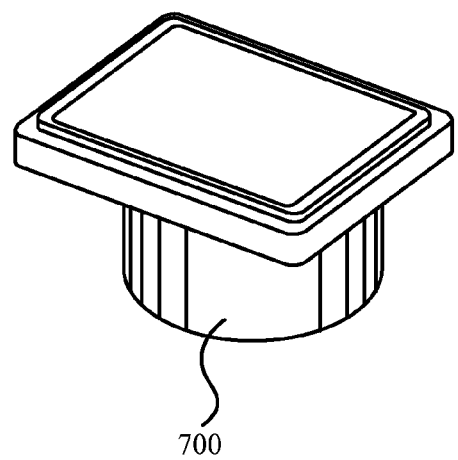
FIGS. 7A and 7B show a flip-chip photodiode used in conjunction with an optical communication device according to one embodiment.
Figure 7B:
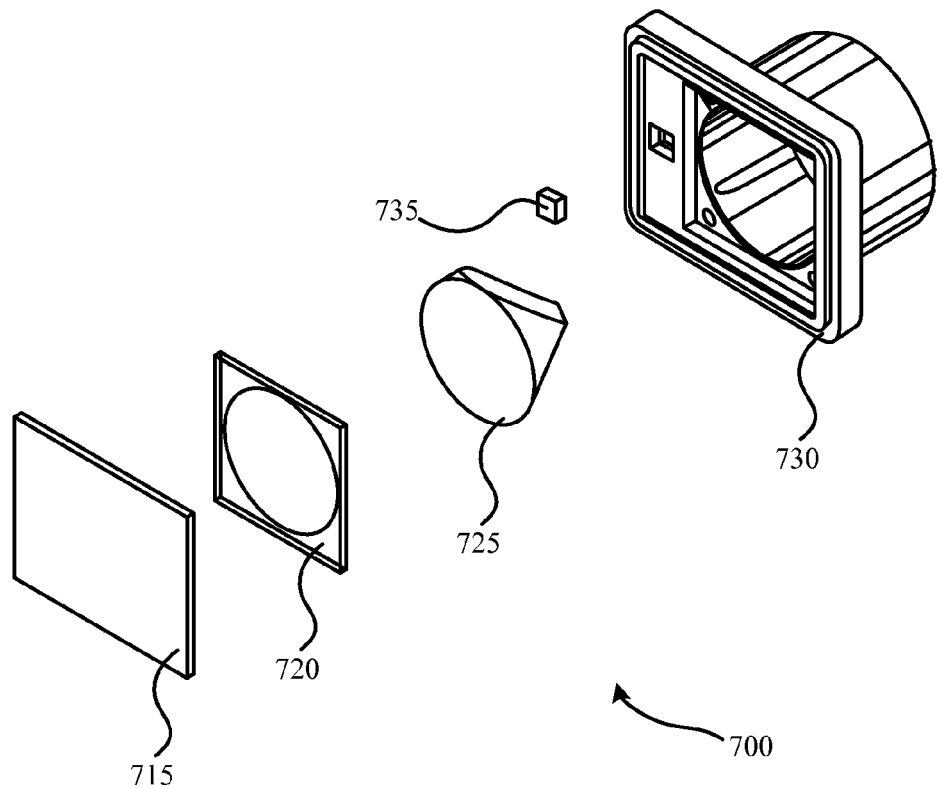

FIG. 7B shows an exploded view of an optical communication device that includes a flip-chip photodiode 735 according to one embodiment. A housing 730 contains a retro-reflector 725, a modulating quantum well modulator 720, a window 715 and a photodiode 735. The quantum well modulator 720 may modify or add information to the signal after reflection through the retro-reflector 725. FIG. 7A shows an unexploded packaged view of the optical communication device.

Specific details are given in the above description to provide a thorough understanding of the embodiments. However, it is understood that the embodiments may be practiced without these specific details. For example, circuits, structures, and/or components may be shown in block diagrams in order not to obscure the embodiments in unnecessary detail. In other instances, well-known circuits, processes, algorithms, structures, components, and techniques may be shown without unnecessary detail in order to avoid obscuring the embodiments.

While the principles of the disclosure have been described above in connection with specific apparatuses and methods this description is made only by way of example and not as limitation on the scope of the disclosure.

What is claimed is:

1. A flip-chip photo diode, comprising: a substrate having a top and a bottom, wherein the substrate filters incident light; an active layer comprising a top and a bottom, wherein the top of the active layer is disposed below the bottom of the substrate; a plurality of interconnects coupled with the bottom of the active layer and configured to couple with a circuit board; and a plurality of wire bonds directly coupled with the top surface of the substrate and configured to couple with a circuit board.

2. The flip-chip photodiode according to claim 1, wherein the plurality of interconnects comprise at least one solder ball or at least one epoxy bump.

3. The flip-chip photodiode according to claim 1, wherein the substrate layer comprises indium phosphide.

4. The flip-chip photodiode according to claim 1, wherein the active layer comprises a material selected from the group consisting of indium gallium arsenide, gallium arsenide, aluminum gallium arsenide, silicon, germanium, and lead sulfide.

5. The flip-chip photodiode according to claim 1, wherein the substrate comprises silicon.

6. The flip-chip photodiode according to claim 1, further comprising an antireflective coating on the top surface of the substrate.

7. The flip-chip photodiode according to claim 1, wherein the substrate is used as a sunlight filter that eliminates the need for an added filter component.

8. The flip-chip photodiode according to claim 1, wherein the substrate reduces photocurrent.

9. The flip-chip photodiode according to claim 1, wherein the substrate reduces power consumption when reverse biased.

* * * * *